United States Patent [19]
Chan et al.

[11] Patent Number: 5,874,769
[45] Date of Patent: Feb. 23, 1999

[54] MOSFET ISOLATION STRUCTURE WITH PLANAR SURFACE

[75] Inventors: Tsiu Chiu Chan, Carrollton; Frank Randolph Bryant, Denton, both of Tex.

[73] Assignee: STMicroelectronics, Inc., Carrollton, Tex.

[21] Appl. No.: 182,809

[22] Filed: Jan. 14, 1994

Related U.S. Application Data

[62] Division of Ser. No. 889,822, May 29, 1992, Pat. No. 5,310,692.

[51] Int. Cl.$^6$ ............................................. H01L 23/58
[52] U.S. Cl. ......................... 257/510; 257/519; 257/647; 257/648; 257/374
[58] Field of Search ................... 257/506, 509, 257/510, 513, 518, 519, 647, 648, 755, 374

[56] References Cited

U.S. PATENT DOCUMENTS

| | | | |
|---|---|---|---|
| 4,407,696 | 10/1983 | Han et al. ................................. | 437/69 |
| 4,419,813 | 12/1983 | Iwai . | |
| 4,842,675 | 6/1989 | Chapman et al. . | |
| 5,073,813 | 12/1991 | Morita et al. ............................ | 257/506 |
| 5,122,473 | 6/1992 | Mazzali .................................... | 257/506 |

FOREIGN PATENT DOCUMENTS

| | | | |
|---|---|---|---|
| 0 488 625 A2 | 6/1992 | European Pat. Off. ........ | H01L 21/76 |
| 0 526 212 A2 | 2/1993 | European Pat. Off. ........ | H01L 21/76 |

OTHER PUBLICATIONS

IEEE Trans. on Electron Devices, vol. 38, No. 4, Apr. 1991, by Hayden et al., pp. 876–886, "A High–Performance Half–Micrometer Generation CMOS Technology for Fast SRAM's".

J. Electrochem. Soc., vol. 136, No. 12, Dec. 1989, by Guldi et al., pp. 3815–3820, "Characterization of Poly–Buffered LOCOS in Manufacturing Environment".

J. Electrochem. Soc., vol. 137, No. 6, Jun. 1990, by Lutz et al., pp. 1867–1870, "Field Oxide Thinning in Poly Buffer LOCOS Isolation with Active Area Spacing to 0.1 $\mu$m".

IEEE Electron Device Letters, vol. 11, No. 11, Nov. 1990, by Sung et al., pp. 549–551, "Reverse L–Shape Sealed Poly–Buffer LOCOS Technology".

IEEE Trans. on Electron Device, vol. 38, No. 12, Dec. 1991, by Juengling et al., p. 2721, "Integration of Poly Buffered LOCOS and Gate Processing for Submicrometer Isolation Technique".

1980 IEDM 565ff, by Matsunaga et al., "Selective Polysilicon Oxidation Technology for Defect Free Isolation".

*Primary Examiner*—John Guay
*Attorney, Agent, or Firm*—Theodore E. Galanthay; Lisa K. Jorgenson; Christopher F. Regan

[57] ABSTRACT

A method is provided for a planar surface of a semiconductor integrated circuit, and an integrated circuit formed according to the same. A conductive layer is formed over a substrate. A silicon nitride layer is formed over the conductive layer. A photoresist layer is then formed and patterned over the silicon nitride layer. The silicon nitride layer and the conductive layer are etched to form an opening exposing a portion of the substrate. The photoresist layer is then removed. The exposed substrate and a portion of the conductive layer exposed along the sidewalls in the opening are oxidized. An planarizing insulating layer such as spin-on-glass is formed over the silicon nitride layer and in the opening. The insulating layer is etched back to expose the silicon nitride wherein an upper surface of the insulating layer is level with an upper surface of the conductive layer. The silicon nitride layer is then removed. A planar silicide layer is then formed over the conductive layer.

8 Claims, 1 Drawing Sheet

MOSFET ISOLATION STRUCTURE WITH PLANAR SURFACE

This is a Division of application Ser. No. 07/889, 822, filed May 29, 1992 now U.S. Pat. No. 5,310,692.

FIELD OF THE INVENTION

The present invention relates generally to semiconductor integrated circuit processing, and more specifically to forming a MOSFET structure having a planarsurface.

BACKGROUND OF THE INVENTION

The manufacturing costs of integrated circuits are largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions. These geometries and sizes are often dependent upon the photolithographic resolution available fort he particular manufacturing facility. The goal of photolithography in establishing the horizontal dimensions of the various devices and circuits is to create a pattern which meets design requirements as well as to correctly align the circuit pattern on the surface of the wafer. As line widths shrink smaller and smaller in submicron photolithography, the process to print lines and contact holes in photoresist becomes increasingly more difficult.

With circuit advancement to the very-large-scale integration (VLSI) levels, more and more layers are added to the surface of the wafer. These additional layers in turn create more steps on the wafer surface. The resolution of small image sizes in photolithography thus becomes more difficult over the additional steps due to light reflection and the thinning of the photoresists over the steps. Planarization techniques are generally incorporated to offset the effects of a varied topography.

In addition to the planarization techniques used to increase photolithographic resolution, the chip area also depends on the isolation technology used. Sufficient electrical isolation must be provided between active circuit elements so that leakage current does not cause functional or specification failures. Increasingly stringent specifications, together with the demand, for example, for smaller memory cells in denser memory arrays, places significant pressure on the isolation technology in memory devices, as well as in other modern integrated circuits.

A well-known and widely-used isolation technique is the local oxidation of silicon, commonly referred to as LOCOS. The LOCOS process was a great technological improvement in reducing the area needed for the isolation regions and decreasing some parasitic capacitances. LOCOS field oxide is generally formed to a sufficient thickness that a conductor placed over the field oxide will not invert the channel underneath, when biased to the maximum circuit voltage. The LOCOS field oxide, however, as well as other isolation techniques, adds topography to the integrated circuit surface. The additional topography is a result of the silicon dioxide necessarily occupying a greater volume than that of the silicon prior to its oxidation, due to the reaction of the silicon to oxygen. As a result, the surface of conventional LOCOS field oxide is above the surface of the active regions, with approximately half of the oxide thickness being above the active region surface. This topography requires overlying conductors to cover steps at the edges of the field oxide which presents the potential for problems in etching the conductor layer and in the reliability of the conductor layer. In addition, the depth of field for submicron photolithography can be exceeded by the topography of the wafer surface.

It is therefore an object of this invention to provide a method of forming an isolation structure having a surface which is substantially coplanar with the surface of the adjacent active regions.

It is a further object of this invention to provide such a method which can be used for both wide and narrow isolation locations.

It is a further object of this invention to provide such a method which utilizes thermal silicon dioxide as the isolation material.

It is a further object of this invention to provide such a method which substantially fills the isolation recesses with a planarizing insulating layer.

Other objects and advantages of the invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby, by forming a conductive layer over a substrate. An opening is formed through the conductive layer to expose a portion of the substrate. A portion of the exposed substrate is etched away in the opening. The exposed substrate remaining in the opening is then oxidized along with a portion of the conductive layer along the sidewalls in the opening. A planarizing insulating region is formed in the opening. A planar silicide layer is then formed over the planarizing insulating region and the conductive layer.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
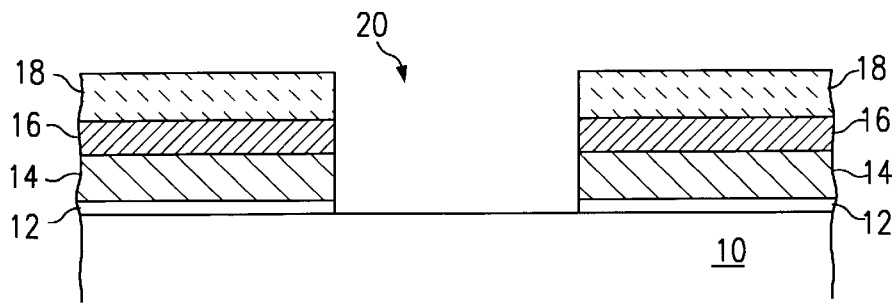
FIGS. 1–4 are cross sectional views of the fabrication of a semiconductor integrated circuit according to the present invention.

Referring to FIG. 1, an integrated circuit is to be formed on a silicon substrate 10. A gate oxide layer 12 is formed over the silicon substrate 10. A polysilicon layer 14 is formed over the gate oxide. Layer 14 will typically be doped appropriately to form the gate electrode of a field effect transistor. Typically, polysilicon layer 14 will have a thickness of approximately 1500 angstroms. A silicon nitride layer 16 is formed over the polysilicon layer 14 to a thickness of approximately 500 angstroms. A photoresist layer is then formed over the silicon nitride and patterned to form an opening through the underlying layers having approximately a 0.6 micron width. The silicon nitride layer 16, polysilicon layer 14 and gate oxide layer 12 are etched to form an opening 20, exposing the silicon substrate layer 10 in the opening. The formation and etching of the various layers are according to conventional processes. It should be noted that this invention is applicable to single-well CMOS processes, twin-well or twin-tub CMOS processes, as well as to other technologies including bipolar, n-channel and p-channel MOS, and BiCMOS technologies. Such technologies may have their active devices formed directly into a monolithic substrate or into an epitaxial layer at the surface of a substrate. It is contemplated that the present invention is applicable to, and advantageous when implemented into, such other technologies.

Figure 2:
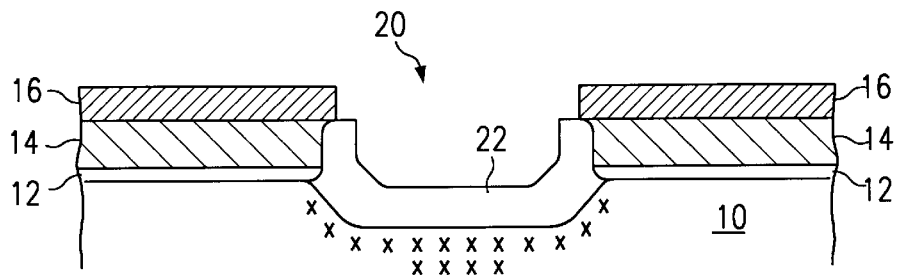

Referring to FIG. 2, a portion of the substrate 10 is etched away in the opening. Preferably, approximately 2000 angstroms will be etched away using a conventional process. The photoresist layer 18 is removed. A channel stop implant, represented by the Xs, may be made in the silicon substrate to assist the electrical isolation by increasing the parasitic threshold voltage, in the conventional manner. The channel stop implant will provide adequate doping of the area in the opening which will serve as the isolation structure. Isolation will also be improved by implanting the sides of the recess in substrate 10 formed after the etch of the substrate. This can be accomplished by a rotating angle implant, as is known in the art, for the ion implantation of the sides of recesses and trenches.

The exposed silicon substrate 10 in the opening undergoes thermal oxidization to form an oxidized region 22. The oxidation process generally occurs at 900° C. for 30 minutes. Thermal oxidation will also oxidize a portion of the polysilicon layer 14 along the sidewalls in the opening 20. It should be noted that the thermal oxidation of the silicon substrate 10 and the polysilicon along the sidewalls in opening 20 is performed with the silicon nitride layer 16 acting as a mask over the surfaces of active devices. The use of silicon nitride acts as an oxidation barrier to prevent oxidation of an upper surface of the polysilicon layer 14. The width of the oxidized area, or the isolation area which now separates the polysilicon layer 14, is now approximately 0.7 microns wide instead of the original 0.6 micron width. The thickness of the isolation area will typically be approximately 4000 angstroms. A small birds beak will be grown during the oxidation step between the silicon-substrate and the polysilicon layer 14 along the edge. The birds beak rounds the sharp corners of the active regions which will help to reduce the high electrical fields created by the polysilicon gate electrode corners and will help to reduce the leakage tendency of the parasitic field oxide transistor.

Figure 3:
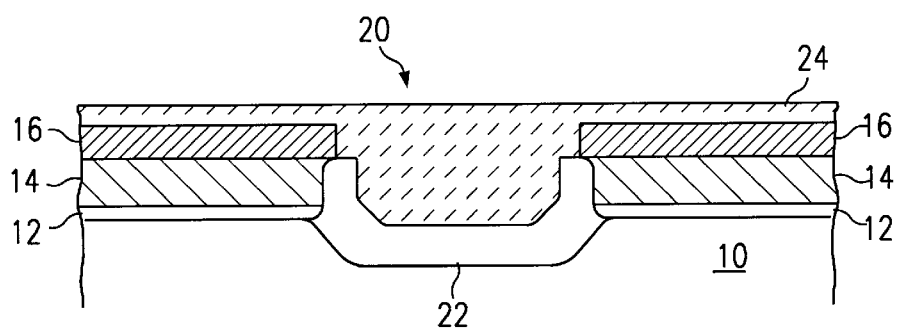

Referring to FIG. 3, an insulating layer 24 is formed over the silicon nitride layer 16 and in the opening 20. The insulating layer 24 is preferably a planarizing layer such as spin-on-glass (SOG). For purposes of illustration, the insulating layer 24 will be referred to as SOG.

Figure 4:
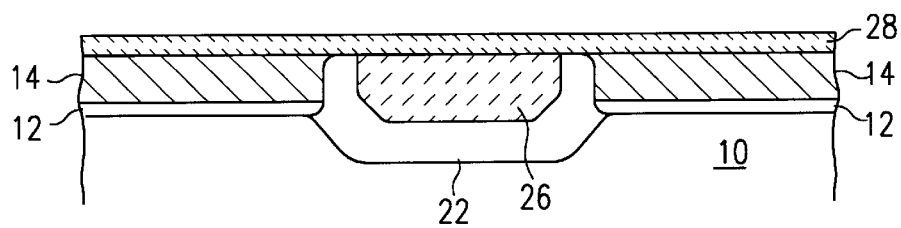

Referring to FIG. 4, the SOG is etched back to form a SOG region 24 so that it is approximately level with the polysilicon layer 14. Forming the SOG in the opening fills the isolation area opening and planarizes the integrated circuit at the level of the polysilicon layer 14. The silicon nitride layer 16 is then removed and a conformal silicide layer 28 is formed over the polysilicon layer 14, portions of the oxidized region 22 and the SOG 24. The silicide layer 28 is planar because the underlying polysilicon and SOG layers are substantially coplanar. The polysilicon layer 14 and the silicide layer 28 can then be patterned and etched according to conventional methods to form gate electrodes.

The method of substantially planarizing the conductive layer before forming the gate electrodes provides significant advantages over the prior art. The process is well suited for forming submicron isolation areas. The formation of the active area isolation structure comprising the oxidation region 22 and SOG 26 insures greater planarization of the integrated circuit before the gate electrode patterning while maintaining submicron isolation areas. The planar surface will assist in the ability to print uniform image lines and spaces.

Figure 5:
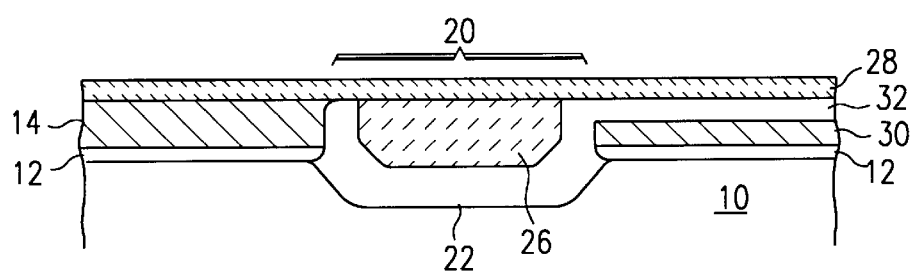
FIG. 5 is a cross section view of an alternative fabrication method of a semiconductor integrated circuit according to the present invention.

Referring to FIG. 5, large areas of isolation, however, may also be formed. Before oxidation of the substrate, the silicon nitride is removed over a larger area which will act as an isolation area. A photoresist layer (not shown) or mask is formed over the silicon nitride which is to be retained. A portion of the polysilicon layer may also be removed which underlies the portion of the silicon nitride which is to be removed. For example, 500 angstroms of the polysilicon layer 14 may be removed, leaving an area comprising a thinner layer of polysilicon 30 overlying the gate oxide layer 12. Alternatively, all of the polysilicon may be removed-which underlies the removed nitride layer. Thermal oxidation of the substrate forming thermal oxidized region 22 will also oxidize a portion of the remaining polysilicon layer 30 along the sidewall in opening 20. Since a portion of the silicon nitride layer was removed, an upper surface of the exposed polysilicon layer 30 will also oxidize to form region 32.

Retention of any polysilicon in the larger isolation area will not have a significant impact on the performance of devices having signal lines, for example, which cross over the thinner polysilicon layer 30. This is due to the fact that the larger area is surrounded by a trench comprising the oxidized region 22 and the SOG 26 which will electrically isolate the various devices. In addition, any polysilicon remaining in the larger isolation area will increase the planarity of the oxidized and SOG regions. As additional advantage of retaining some of the polysilicon, for example, 500 angstroms, will allow the polysilicon layer 30 to be optionally tied to Vss to achieve radiation (RAD) protection.

In one embodiment of the invention, the oxidized region has a thickness of approximately 1000 angstroms.

While the invention has been particularly shown and described with reference to a preferred embodiment, it will be understood by those skilled in the art that various changes in form and detail may be made therein without departing from the spirit and scope of the invention.

What is claimed is:

1. An integrated circuit device structure, comprising:
   a silicon substrate, having active devices formed at a first surface thereof;
   a conductive structure overlying and insulated from a portion of the substrate, and having an opening therethrough exposing a portion of said substrate, said conductive structure being polycrystalline and predominantly comprising silicon;
   an oxide region recessed into an upper surface of the exposed substrate and laterally abutting a portion of said conductive structure at sidewalls of said opening, said oxide region having a concave upper surface, wherein said oxide region also extends laterally over an upper surface of a portion of said conductive structure, and is cover by a silicide layer; and a region of planarizing dielectric material, which is not identical to said oxide region, filling said concave upper surface of said oxide region in said opening;

wherein the active devices are laterally isolated only by said oxide region and said planarizing dielectric material.

2. The structure of claim 1, wherein said planarizing dielectric material comprises spin-on-glass.

3. The structure of claim 1, wherein said oxide region also extends laterally over part, but not all, of an upper surface of a portion of said conductive structure.

4. The structure of claim 1, wherein said conductive structure comprises a polysilicon layer disposed over a gate oxide layer.

5. The structure of claim 1, further comprising an implanted dopant concentration in said substrate underlying said oxide region.

6. The structure of claim 1, further comprising a planar layer of metallic conductivity overlying said conductive structure.

7. The structure of claim 1, further comprising a planar layer of metallic conductivity overlying said conductive structure and said oxide region.

8. The structure of claim 1, wherein said oxide region has a thickness of approximately 1000 Å.

* * * * *

UNITED STATES PATENT AND TRADEMARK OFFICE
CERTIFICATE OF CORRECTION

PATENT NO. : 5,874,769
DATED : February 23, 1999
INVENTOR(S) : CHAN ET AL.

It is certified that error appears in the above-identified patent and that said Letters Patent is hereby corrected as shown below:

Column 1, line 10
Delete:
"planarsurface"

Insert:
-- planar surface --

Column 1, line 22
Delete:
"fort he"

Insert:
-- for the --

Signed and Sealed this

Twenty-ninth Day of June, 1999

Q. TODD DICKINSON

*Attest:*

*Attesting Officer*     *Acting Commissioner of Patents and Trademarks*